United States Patent
Sheen et al.

(10) Patent No.: US 8,178,921 B2
(45) Date of Patent: May 15, 2012

(54) SEMICONDUCTOR DEVICE HAVING REDUCED STANDBY LEAKAGE CURRENT AND INCREASED DRIVING CURRENT AND METHOD FOR MANUFACTURING THE SAME

(75) Inventors: Dong Sun Sheen, Kyoungki-do (KR); Sang Tae Ahn, Kyoungki-do (KR); Seok Pyo Song, Seoul (KR); Hyeon Ju An, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/638,233

(22) Filed: Dec. 15, 2009

(65) Prior Publication Data

US 2010/0090290 A1  Apr. 15, 2010

Related U.S. Application Data

(62) Division of application No. 11/776,885, filed on Jul. 12, 2007, now Pat. No. 7,655,533.

(30) Foreign Application Priority Data

Sep. 29, 2006 (KR) .................. 10-2006-0096543

(51) Int. Cl.
*H01L 29/78* (2006.01)
(52) U.S. Cl. ............. 257/330; 257/508; 257/E29.28
(58) Field of Classification Search .......... 257/327, 257/401, 297, 330, 508, 510, E29.28
See application file for complete search history.

(56) References Cited

U.S. PATENT DOCUMENTS

| | | | | |
|---|---|---|---|---|
| 7,176,067 B2* | 2/2007 | Jung et al. | | 438/144 |
| 7,385,247 B2* | 6/2008 | Rhee et al. | | 257/329 |
| 7,671,420 B2* | 3/2010 | Shin et al. | | 257/369 |
| 2005/0173740 A1 | 8/2005 | Jin | | |
| 2005/0233525 A1* | 10/2005 | Yeo et al. | | 438/283 |
| 2005/0282342 A1* | 12/2005 | Adan | | 438/294 |
| 2006/0231874 A1* | 10/2006 | Popp et al. | | 257/288 |
| 2006/0231918 A1* | 10/2006 | Popp et al. | | 257/510 |
| 2008/0006908 A1* | 1/2008 | Lin et al. | | 257/619 |

FOREIGN PATENT DOCUMENTS

| | | |
|---|---|---|
| CN | 1770470 A | 5/2006 |
| WO | WO 03003470 A2 * | 1/2003 |

OTHER PUBLICATIONS

USPTO Office Action mailed Apr. 24, 2009 in connection with U.S. Appl. No. 11/776,885.

* cited by examiner

*Primary Examiner* — David Vu
*Assistant Examiner* — Earl Taylor
(74) *Attorney, Agent, or Firm* — Ladas & Parry LLP

(57) ABSTRACT

A semiconductor device includes a semiconductor substrate having an active region which includes a gate forming zone and an isolation region; an isolation layer formed in the isolation region of the semiconductor substrate to expose side surfaces of a portion of the active region including the gate forming zone, such that the portion of the active region including the gate forming zone constitutes a fin pattern; a silicon epitaxial layer formed on the active region including the fin pattern; and a gate formed to cover the fin pattern on which the silicon epitaxial layer is formed.

4 Claims, 4 Drawing Sheets

SEMICONDUCTOR DEVICE HAVING REDUCED STANDBY LEAKAGE CURRENT AND INCREASED DRIVING CURRENT AND METHOD FOR MANUFACTURING THE SAME

CROSS-REFERENCE TO RELATED APPLICATIONS

The present application claims priority to Korean patent application number 10-2006-0096543 filed on Sep. 29, 2006, which is incorporated herein by reference in its entirety.

BACKGROUND OF THE INVENTION

The present invention relates to a semiconductor device, and more particularly to a semiconductor device which has a fin transistor formed to reduce standby leakage current and increase driving current, and a method for manufacturing the same.

As the design rule of below 100 nm is applied for fabricating semiconductor devices, decreased channel length and width and increased doping concentration of a junction region of a transistor cause the junction leakage current to increase due to the increased number of electric fields. Then, it is difficult to achieve the threshold voltage demanded in a highly integrated semiconductor device by utilizing a transistor having the conventional planar channel structure, and there are limitations in improving the refresh characteristic of the semiconductor device.

Thus, a transistor having a three-dimensional channel structure has been studied in an effort to increase the channel length. A fin transistor is one type that has a three-dimensional channel structure. To form a fin transistor, a fin pattern having a projecting active region is formed by recessing an isolation layer, and a gate is then formed to cover the fin pattern. In the fin transistor, the short channel effect can be suppressed due to lowering of the drain induced barrier lowering (DIBL), and a current drive characteristic can be significantly improved since the channels are formed on all three exposed surfaces of the active region.

However, the conventional fin transistor has problems in that the standby leakage current increases since the threshold voltage is decreased. In order to cope with the problems due to the increased standby leakage current, a method for adopting a negative word line has been suggested. Nevertheless, this method is not practical for actual practice due to complicated manufacturing procedures and complex circuitry of the semiconductor device and also due to the increased power consumption of the semiconductor device.

Further, the conventional fin transistor has problems due to decreasing driving current as the integration degree of a semiconductor device increases. One way proposed to solve the problems due to decreasing driving current is to increase the height of the fin pattern. However, more defects are produced by increasing the height of the fin pattern as follows.

First, as a process for forming an isolation layer, a flowable insulation layer such as a spin-on glass (SOG) oxide layer is filled in the lower end of a trench, and an high density plasma (HDP) oxide layer is formed on the SOG oxide layer in order to improve the gap-fill capability for trenches. In this case, increasing the height of a fin pattern leads to the increased loss of an isolation layer, and the loss of the isolation layer would lead to the exposure of the SOG oxide layer, which has a high wet etch rate, thereby degrading the isolation characteristics of the semiconductor device.

Second, increasing the height of the fin pattern may lead to poor etching performance in a subsequent gate forming process, by which the gates may be short-circuited leading to a device failure.

Thus, to address the above-described problems associated with high integration of semiconductor devices, there is a need to reduce the standby leakage current of a transistor and to increase the driving current at the same height of the fin pattern and with the same threshold voltage.

SUMMARY OF THE INVENTION

An embodiment of the present invention is directed to a semiconductor device which has a fin transistor formed to reduce standby leakage current and prevent driving current from decreasing due to trend toward high integration, and a method for manufacturing the same.

In one embodiment, a semiconductor device comprises a semiconductor substrate having an active region which includes a gate forming zone and an isolation region; an isolation layer formed in the isolation region of the semiconductor substrate to expose side surfaces of a portion of the active region including the gate forming zone, such that the portion of the active region including the gate forming zone constitutes a fin pattern; a silicon epitaxial layer formed on the active region including the fin pattern; and a gate formed to cover the fin pattern on which the silicon epitaxial layer is formed.

The fin pattern has a height of 100~1,500 Å.

The silicon epitaxial layer is formed to a thickness of 50~500 Å.

The silicon epitaxial layer comprises a pure Si epitaxial layer or an $Si_xGe_{(1-x)}$ epitaxial layer containing Ge.

In another embodiment, a method for manufacturing a semiconductor device comprises the steps of forming an isolation layer in an isolation region of a semiconductor substrate which has an active region including a gate forming zone and the isolation region, to expose side surfaces of a portion of the active region including the gate forming zone, such that the portion of the active region including the gate forming zone constitutes a fin pattern; forming a silicon epitaxial layer on the active region including the fin pattern; and forming a gate to cover the fin pattern on which the silicon epitaxial layer is formed.

The step of forming an isolation layer to expose side surfaces of a portion of the active region, which defines the gate forming zone, comprises the steps of forming an isolation layer in the isolation region of the semiconductor substrate; forming a first mask pattern of a line type on the semiconductor substrate having the isolation layer formed therein, to expose the gate forming zone of the active region and the isolation layer; forming a second mask pattern on the semiconductor substrate including the first mask pattern, to expose the gate forming zone of the active region and portions of the isolation layer which are adjacent to the gate forming zone; etching the exposed portions of the isolation layer which are adjacent to the gate forming zone, using the first and second mask patterns as an etch mask; and removing the first and second mask patterns.

The step of etching the exposed portions of the isolation layer which are adjacent to the gate forming zone is implemented such that the side surfaces of the portion of the active region, which defines the gate forming zone, are exposed at a height of 100~1,500 Å.

The step of etching the exposed portions of the isolation layer which are adjacent to the gate forming zone is implemented through dry plasma etching.

After the step of forming the isolation layer and before the step of forming the silicon epitaxial layer, the method further comprises the step of wet etching the exposed portions of the isolation layer which are adjacent to the gate forming zone, to increase an etched area of the portions of the isolation layer which are adjacent to the gate forming zone.

The step of forming the silicon epitaxial layer is implemented in a vacuum chamber or a vacuum furnace at a temperature of 500~900° C. and under a pressure of 5 mTorr to 30 Torr.

The step of forming the silicon epitaxial layer is implemented using one of $SiH_4$ gas, $Si_2H_6$ gas and $SiH_2Cl_2$ gas as source gas and using HCl gas or $H_2$ gas as reaction gas.

The silicon epitaxial layer is formed to a thickness of 50~500 Å.

The silicon epitaxial layer is formed as a pure epitaxial layer or an $Si_xGe_{(1-x)}$ epitaxial layer containing Ge.

In still another embodiment, a method for manufacturing a semiconductor device comprises the steps of forming an isolation layer in an isolation region of a semiconductor substrate which has an active region including a gate forming zone and the isolation region; forming a first mask pattern of a line type on the semiconductor substrate having the isolation layer formed therein, to expose the gate forming zone of the active region and the isolation layer; forming a second mask pattern on the semiconductor substrate including the first mask pattern, to expose the gate forming zone of the active region and portions of the isolation layer which are adjacent to the gate forming zone; etching the exposed portions of the isolation layer which are adjacent to the gate forming zone, and thereby forming a fin pattern in which the gate forming zone of the active region projects; removing the first and second mask patterns; forming a silicon epitaxial layer on the active region including the fin pattern; and forming a gate to cover the fin pattern on which the silicon epitaxial layer is formed.

The fin pattern is formed to have a height of 100~1,500 Å.

Etching of the exposed portions of the isolation layer which are adjacent to the gate forming zone, for forming the fin pattern, is implemented as dry plasma etching.

After the step of removing the first and second mask patterns and before the step of forming the silicon epitaxial layer, the method further comprises the step of implementing wet etching to increase an etched area of the portions of the isolation layer which are adjacent to the fin pattern.

The wet etching is conducted using diluted HF solution or diluted $NH_4+HF$ solution.

The step of forming the silicon epitaxial layer is implemented in a vacuum chamber or a vacuum furnace at a temperature of 500~900° C. and under a pressure of 5 mTorr to 30 Torr.

The step of forming the silicon epitaxial layer is implemented using one of $SiH_4$ gas, $Si_2H_6$ gas and $SiH_2Cl_2$ gas as source gas and using HCl gas or $H_2$ gas as reaction gas.

The silicon epitaxial layer is formed to a thickness of 50~500 Å.

The silicon epitaxial layer is formed as a pure Si epitaxial layer or an $Si_xGe_{(1-x)}$ epitaxial layer containing Ge impurities.

After the step of removing the first and second mask patterns and before the step of forming the silicon epitaxial layer on the active region, the method further comprises the step of baking the semiconductor substrate which is removed with the first and second mask patterns, to increase a growth rate of the silicon epitaxial layer.

Baking is implemented under an atmosphere of $H_2$ and $N_2$ at a temperature of 600~950° C.

After the step of removing the first and second mask patterns and before the step of forming the silicon epitaxial layer on the active region, the method further comprises the step of implementing a dry cleaning process for the semiconductor substrate which is removed with the first and second mask patterns, to improve growth uniformity of the silicon epitaxial layer.

The dry cleaning process is implemented using HF and water vapor or using plasma which comprises one of HF gas, $NF_3$ gas, $CF_4$ gas and $CHF_3$ gas.

The step of forming a gate comprises the steps of forming a gate insulation layer on the semiconductor substrate including the silicon epitaxial layer; forming sequentially a gate conductive layer and a hard mask layer on the gate insulation layer; and etching the hard mask layer, the gate conductive layer and the gate insulation layer.

The gate insulation layer is made of any one of an $SiO_2$ layer, an SiON layer, an $Al_2O_3$ layer, an $HfO_2$ layer, a $ZrO_2$ layer, a $TiO_2$ layer, and a $Ta_2O_5$ layer.

The gate conductive layer is made of a stack of a polysilicon layer and any one of a $WSi_2$ layer, a W layer, a $CoSi_2$ layer, an $NiSi_2$ layer, a $TaSi_2$ layer, a $TiSi_2$ layer, a Ti layer, a TaN layer, and a TiN layer.

DESCRIPTION OF SPECIFIC EMBODIMENTS

Figure 1:
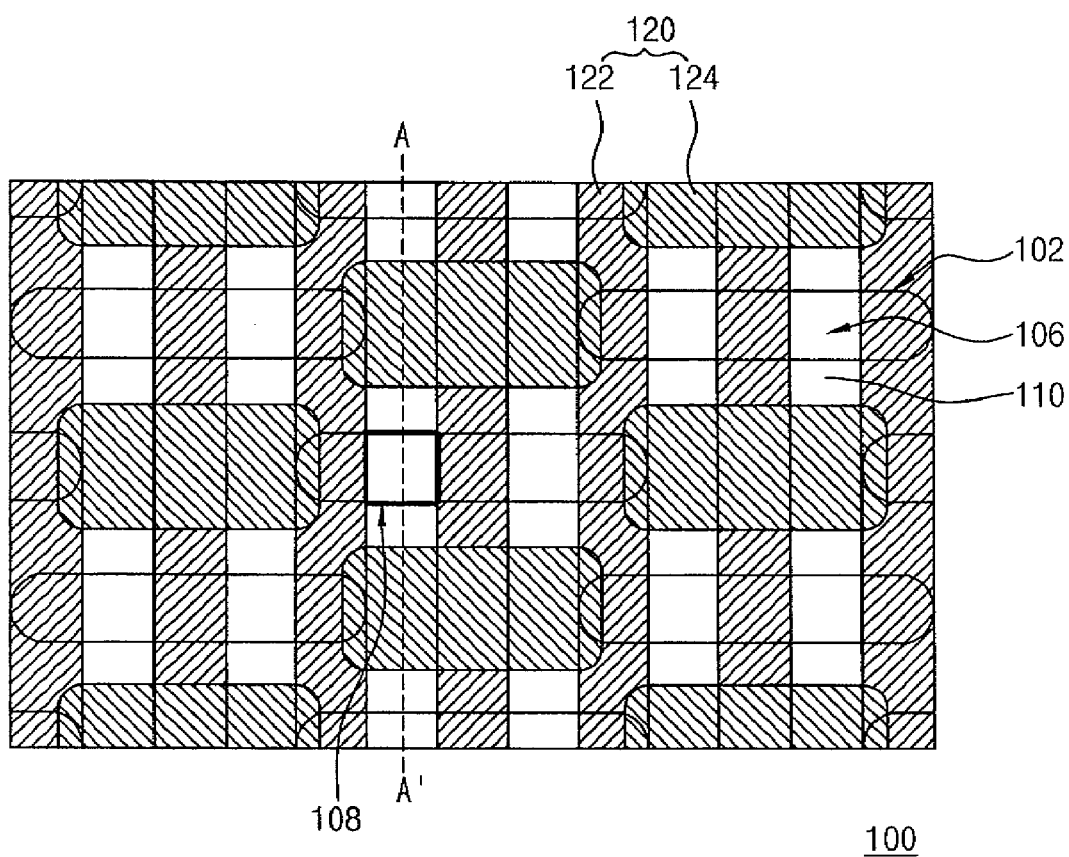
FIG. 1 is a plan view showing the layout a fin transistor according to an embodiment of the present invention.

In the present invention as shown in FIG. 1, a double mask pattern 120, which is comprised of a first mask pattern 122 and a second mask pattern 124, is formed on a semiconductor substrate 100, which has an isolation layer 110 formed therein, such that the gate forming zone 106 of an active region 102 and the portions of the isolation layer 110 adjacent thereto are exposed. Then, by etching the gate forming zone 106 of the active region 102 and the portions of the isolation layer 110 adjacent thereto which are exposed using the double mask pattern 120 as an etch mask, a fin pattern 108 is formed, in which the gate forming zone 106 of the active region 102 projects upward.

Thereafter, a silicon epitaxial layer is grown on the fin pattern 108 to increase the area of the gate forming zone 106, and a gate is formed to cover the fin pattern 108 including the silicon epitaxial layer, as a result of which a fin transistor is formed.

As a consequence, the channel width of a transistor and a threshold voltage are increased, and the leakage current through a channel in a standby mode can be reduced and driving current can be increased according to an embodiment of the present invention. Also, it is not necessary to increase the height of a fin pattern to increase driving current according to an embodiment of the present invention. Thus, the loss of an isolation layer can be prevented, and there would not be difficulties when forming a gate subsequently, thereby improving the reliability and increasing the yield of the semiconductor devices.

Hereafter, the process steps of a method for manufacturing a semiconductor device in accordance with an embodiment of the present invention will be described in detail with reference to FIG. 2A through 2F which are cross-sectional views taken along the line A-A' of FIG. 1.

Figure 2A:
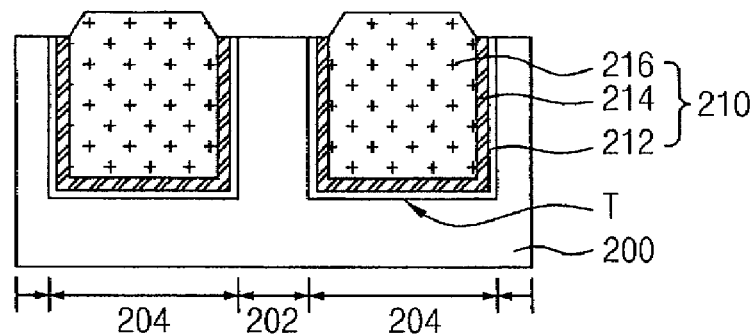
FIG. 2A through 2F are cross-sectional views taken along the line A-A' of FIG. 1, illustrating the process steps of a method for manufacturing a semiconductor device in accordance with an embodiment of the present invention.

Referring to FIG. 2A, a semiconductor substrate 200 has an active region 202 including a gate forming zone and an isolation region 204. A hard mask (not shown) is formed on the semiconductor substrate 200 to expose the isolation region 204. The hard mask (not shown) can be made of a stack of an oxide layer and a nitride layer. By etching the exposed isolation region 204 using the hard mask as an etch mask, the trenches T are formed.

A sidewall oxide layer 212 is formed on the surfaces of the trenches T, and a liner nitride layer 214 is formed on the hard mask including the sidewall oxide layer 212. An insulation layer 216 is formed on the liner nitride layer 214 to fill the trenches T. The insulation layer 216 is made of a single layer of a high density plasma-chemical vapor deposition (HDP-CVD) oxide layer, an tetraethoxysilane ($O_3$-TEOS) oxide layer, or an spin-on glass (SOG) layer, or a stack of any combination thereof. After chemically and mechanically polishing (hereinafter "CMPing") the insulation layer 216 and the liner nitride layer 214 to expose the hard mask, an isolation layer 210 is formed in the isolation region 204 of the semiconductor substrate 200 by removing the exposed hard mask in such a way as to delimit (or define) the active region 202.

Figure 2B:
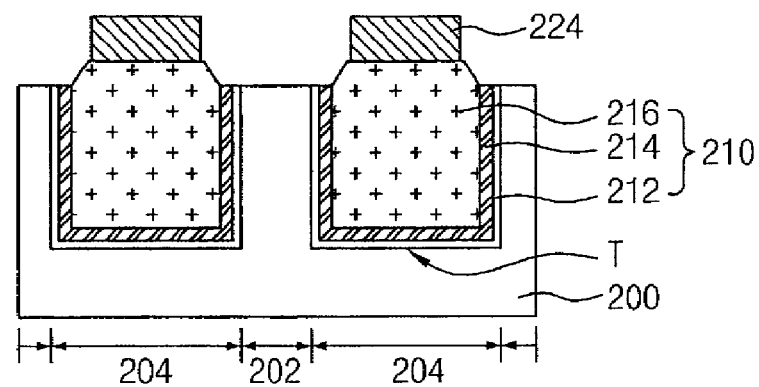

Referring to FIG. 2B, a first mask pattern (see FIG. 1, 122) is formed on the semiconductor substrate 200 having the isolation layer 210 to expose the gate forming zone of the active region 202 and the isolation layer 210. A second mask pattern 224 is formed on the semiconductor substrate 200 including the first mask pattern to expose the gate forming zone of the active region 202 and the portions of the isolation layer 210 which are adjacent to the gate forming zone. As shown in FIG. 1, the first mask pattern 122 is formed in a line type in such a way as to expose the gate forming zone of the active region 202 and the isolation layer 210.

Figure 2C:
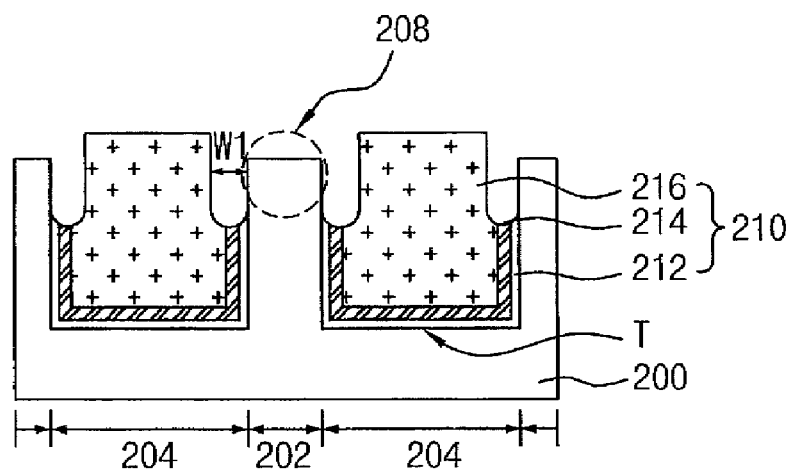

Referring to FIG. 2C, the exposed gate forming zone of the active region 202 and the exposed portions of the isolation layer 210 adjacent to the gate forming zone are primarily etched using the double mask pattern made of the first mask pattern and the second mask pattern 224 as an etch mask, and through this, a fin pattern 208 is formed such that the gate forming zone of the active region 202 projects. Then, the first and second mask patterns used as the etch mask are removed. W1 shown in FIG. 2C denotes the etched area of the isolation layer 210 that has been locally and primarily etched.

Here, the primary etching for forming the fin pattern 208 can be performed by a dry etching using plasma such that the fin pattern 208 having a height of 100~1,500 Å is formed. When implementing the primary etching, most of the isolation layer 210 is etched due to a difference in the etch selectivity between the active region 202 and the isolation layer 210, but the etched amount of the active region 202 is not substantial. The fin pattern 208 is formed as a result. Therefore, because the etching for forming the fin pattern 208 is implemented using the double mask pattern comprised of the first mask pattern and the second mask pattern 224, undesired loss of the isolation layer 210 can be prevented according to an embodiment of the present invention.

Figure 2D:
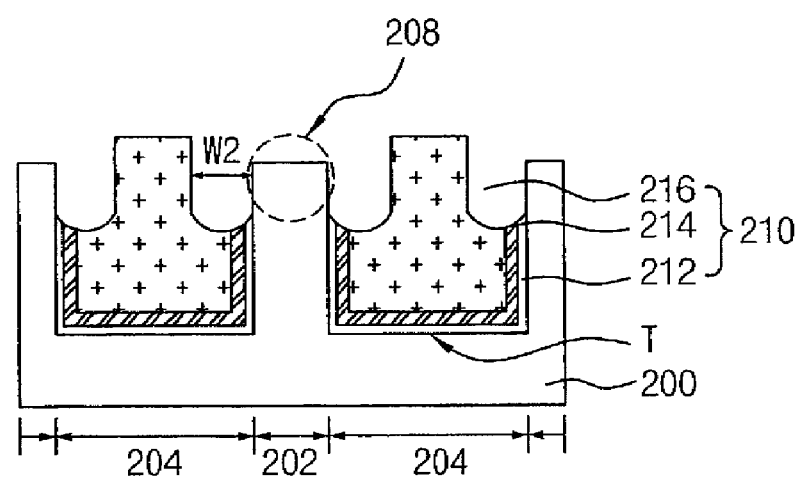

Referring to FIG. 2D, the semiconductor substrate 200 formed with the fin pattern 208 is secondarily etched to increase the etched area W2 of the isolation layer 210. The second etching process is implemented as a wet etching using diluted HF solution or diluted $NH_4$+HF solution.

Figure 2E:
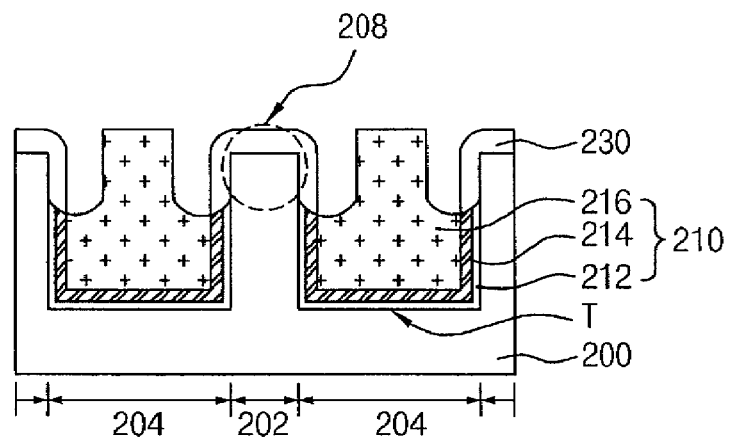

Referring to FIG. 2E, by conducting a selective epitaxial growth over the semiconductor substrate 200 which has undergone the primary and secondary etching processes, a silicon epitaxial layer 230 is formed on the gate forming zone of the active region 202 of which side surfaces are exposed—that is, on a part of the active region 202 which includes the fin pattern 208. The silicon epitaxial layer 230 comprises a pure Si epitaxial layer or an $Si_xGe_{(1-x)}$ epitaxial layer containing Ge impurities and is formed to a thickness of 50~500 Å. Also, the silicon epitaxial layer 230 is formed in a vacuum chamber or a vacuum furnace at a temperature of 500~900° C. and under a pressure of 5 mTorr to 30 Torr using any one of $SiH_4$ gas, $Si_2H_6$ gas, and $SiH_2Cl_2$ gas as a source gas and using HCl gas or $H_2$ gas as a reaction gas.

Meanwhile, it is preferred that, before forming the silicon epitaxial layer 230 through the selective epitaxial growth, a baking process for increasing the growth rate of the silicon epitaxial layer 230 and a dry cleaning process for improving the growth uniformity of the silicon epitaxial layer 230 be implemented.

The baking process is implemented under an atmosphere of $H_2$ and $N_2$ at a temperature of 600~950° C., and the dry cleaning process is implemented using HF and water vapor or using plasma which comprises any one of HF gas, $NF_3$ gas, $CF_4$ gas and $CHF_3$ gas.

In an embodiment of the present invention, because the silicon epitaxial layer 230 is formed on the surface of the gate forming zone of the active region 202 through implementing the selective epitaxial growth for the semiconductor substrate 200 which is formed with the fin pattern 208, the area of the active region 202 around the fin pattern 208 increases, by which the channel width of a transistor can be increased. Therefore, the driving current of the transistor can be increased according to an embodiment of the present invention.

Figure 2F:
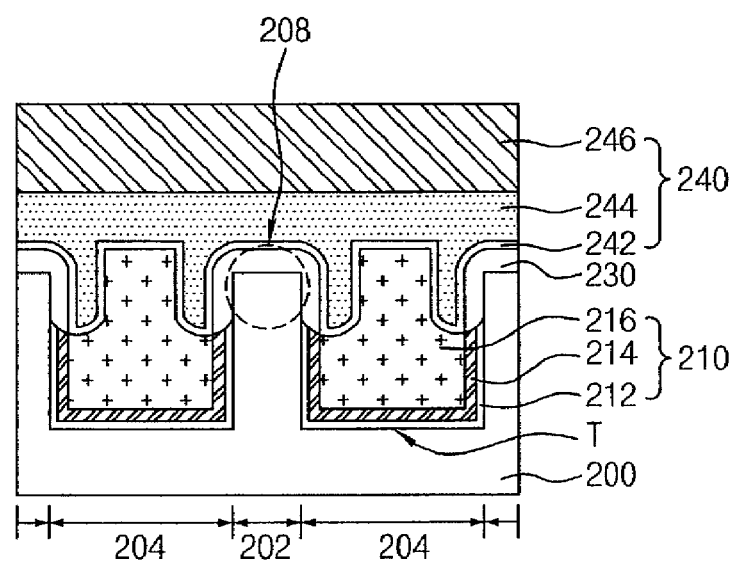

Referring to FIG. 2F, a gate insulation layer 242 is formed on the semiconductor substrate 200 formed with the silicon epitaxial layer 230. The gate insulation layer 242 is made of any one of an $SiO_2$ layer, an SiON layer, an $Al_2O_3$ layer, an $HfO_2$ layer, a $ZrO_2$ layer, a $TiO_2$ layer, and a $Ta_2O_5$ layer. A gate conductive layer 244, which is made of a stack of a polysilicon layer and a metal-based layer, is formed on the gate insulation layer 242. The metal-based layer comprises any one of a $WSi_2$ layer, a W layer, a $CoSi_2$ layer, an $NiSi_2$ layer, a $TaSi_2$ layer, a $TiSi_2$ layer, a Ti layer, a TaN layer, and a TiN layer. A hard mask layer 246, which is made of a silicon nitride layer ($Si_3N_4$), is formed on the gate conductive layer 244. By etching the hard mask layer 246, the gate conductive layer 244 and the gate insulation layer 242, a gate 240, which covers the fin pattern 208 formed with the silicon epitaxial layer 230, is formed.

Thereafter, the formation of a fin transistor is completed by forming source/drain zones in the active region on both sides of the gate 240.

As is apparent from the above description, since an etching process for forming a fin pattern is implemented using a double mask pattern according to an embodiment of the present invention, undesired loss of an isolation layer can be avoided, and since a silicon epitaxial layer is formed on the fin pattern according to an embodiment of the present invention, the channel width of a transistor can be increased.

Accordingly, in the present invention, inverse narrow effect due to a decrease in the channel width can be reduced and a threshold voltage can be increased, thereby suppressing the standby leakage current.

Also, in the present invention, as the channel width is increased, the driving current of a transistor for a unit cell can be increased, and through this, the operation margin of the fin transistor can be increased.

Further, in the present invention, as the channel width is increased, channel resistance can be decreased and the operating speed of an entire semiconductor device can be increased. Hence, the mis-operation by the unit of a bit due to a decrease in the driving speed of an individual cell transistor is prevented, and the manufacturing yield can be increased.

In addition, in the present invention, when assuming the same driving current, a gap-fill process for forming the isolation layer can be easily implemented because the height of the fin pattern is decreased, and when implementing a subsequent process for forming gates, gates are prevented from being short-circuited, whereby the reliability of the gate and the semiconductor device can be improved.

As a result, in the present invention, when forming a fin transistor, since a fin pattern is formed using a double mask pattern and a silicon epitaxial layer is formed on the fin pattern, the channel width of the transistor can be increased. Accordingly, in the present invention, the standby leakage current of the transistor can be decreased through the increase of the channel width, and the reduction of driving current due to high integration of a semiconductor device can be prevented.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a semiconductor substrate having an active region having a gate forming zone and an isolation region;
an isolation layer formed in the isolation region of the semiconductor substrate and having a first portion having a first height and a second portion adjacent to the active region and having a second height less than the first height so as to form an aperture interposed between the first portion and the active region, the aperture exposing side surface of a portion of the gate forming zone of the active region such that the portion of the gate forming zone of the active region constitutes a fin pattern;
a silicon epitaxial layer formed on an upper surface of the fin pattern and formed on a side surface of the fin pattern within the aperture so as to be between the gate forming zone of the active region and the isolation layer; and
a gate formed to cover the fin pattern on the silicon epitaxial layer and formed within the aperture on side surfaces of the isolation layer and the silicon epitaxial layer so as to be interposed between the silicon epitaxial layer and the isolation layer.

2. The semiconductor device according to claim 1, wherein the fin pattern has a height of 100~1,500 Å.

3. The semiconductor device according to claim 1, wherein the silicon epitaxial layer is formed to a thickness of 50~500 Å.

4. The semiconductor device according to claim 1, wherein the silicon epitaxial layer comprises a pure Si epitaxial layer or an $Si_xGe_{(1-x)}$ epitaxial layer containing Ge.

* * * * *